United States Patent [19]
Bonaccio et al.

[11] Patent Number: 6,034,568
[45] Date of Patent: Mar. 7, 2000

[54] BROADBAND DC AMPLIFIER TECHNIQUE WITH VERY LOW OFFSET VOLTAGE

[75] Inventors: Anthony R. Bonaccio, Shelburne, Vt.; Michel S. Michail, Poughkeepsie, N.Y.; W. David Pricer, Charlotte, Vt.

[73] Assignee: International Business Machines Corporation, Armonk, N.Y.

[21] Appl. No.: 09/097,484

[22] Filed: Jun. 15, 1998

[51] Int. Cl.[7] .................................................. H03F 3/45
[52] U.S. Cl. ........................................ 330/253; 330/295
[58] Field of Search ............................. 330/9, 253, 295, 330/302; 327/307

[56] References Cited

U.S. PATENT DOCUMENTS

| | | |
|---|---|---|
| 1,550,684 | 8/1925 | Espenschied . |
| 3,530,389 | 9/1970 | Gormley et al. ............................. 330/9 |
| 3,706,936 | 12/1972 | Krohn . |
| 3,975,691 | 8/1976 | Thepaut . |
| 4,201,947 | 5/1980 | Schade, Jr. . |
| 4,276,513 | 6/1981 | Johnston et al. . |
| 4,306,196 | 12/1981 | Dwarakanath et al. . |
| 4,438,414 | 3/1984 | Blachot . |
| 4,495,470 | 1/1985 | Bristol . |
| 4,543,534 | 9/1985 | Temes et al. . |
| 4,546,324 | 10/1985 | Bingham et al. . |
| 4,697,152 | 9/1987 | Westwick . |
| 4,749,953 | 6/1988 | Gulczynski . |
| 4,829,263 | 5/1989 | Gulczynski . |
| 4,922,535 | 5/1990 | Dolby . |
| 5,061,900 | 10/1991 | Vinn et al. . |
| 5,155,450 | 10/1992 | Schultz ................................... 330/301 |
| 5,410,270 | 4/1995 | Rybicki et al. . |
| 5,512,848 | 4/1996 | Yaklin ...................................... 327/65 |
| 5,576,658 | 11/1996 | Hushimi et al. ........................ 327/552 |

*Primary Examiner*—Robert Pascal
*Assistant Examiner*—Henry Choe
*Attorney, Agent, or Firm*—Delio & Peterson, LLC; Robert Curcio; Eugene I. Shkurko

[57] ABSTRACT

An operational amplifier with two differential input stages is used to separately achieve low offset voltage and broad bandwidth characteristics. One input stage addresses dc and low frequency signals while the other addresses broadband frequencies. All transistors forming the dc stage are biased in the sub-threshold region. Following the two differential input stages, the signal paths are recombined in a capacitive cross-over network that provides outputs for subsequent amplification. The cross over frequency is adjustable from 15 kHz to 50 kHz using small practical values for the cross-over capacitor. The gain balance between the two input stages is adjustable by resistors and/or predetermined width/length ratios of the operational amplifier transistors.

21 Claims, 6 Drawing Sheets

BROADBAND DC AMPLIFIER TECHNIQUE WITH VERY LOW OFFSET VOLTAGE

BACKGROUND OF THE INVENTION

1. Field of the Invention

The present invention relates to the operation of a broadband operational amplifier having a minimized offset voltage, and more particularly to a pair of FET operational amplifiers with capacitively coupled outputs for reducing offset errors, and having one amplifier with operation in the sub-threshold range.

2. Description of Related Art

Bipolar technology continues to offer superior analog performance over CMOS technology. Bipolar operational amplifiers have traditionally offered better gain bandwidth and lower offset voltage than field effect transistor (FET) operational amplifiers. A FET amplifier is best understood as a transconductance amplifier. Generally, an amplifier whose gain has units of conductance is referred to as a transconductance amplifier with the ratio $dI_{out}/dV_{in}$, designated as the transconductance, $g_m$. A major drawback of the FET amplifier is that its transconductance is much lower than that of a bipolar transistor at the same current. Typically, FETs have transconductances of a few thousand micromhos at a few milliamps. In the sub-threshold region of drain current, both FETs and bipolar transistors display transconductance that increases linearly with drain (collector) current. However, the FETs transconductance is somewhat lower as compared to the bipolar transistor. As the drain current, $I_D$, is increased above threshold into the region where $I_D$ is proportional to the square of the source-to-gate voltage, $V_{GS}^2$, the FET transconductance varies as the square root of $I_D$ and is well below the transconductance of a bipolar transistor at the same operating current. The transconductance, in the region above threshold, can be increased by increasing the channel width/length ratio.

Gain bandwidth performance, common to bipolar devices, can be extended to FET operational amplifiers, as described in U.S. pat. application, Ser. No. 08/855,602, entitled "COMPOUND CASCADE AMPLIFIER", filed on May 12, 1997 for Pricer, et al. Low offset voltage, however, remains a challenge to designs incorporating FET devices. Offset voltage is attributable to many sources. The dominant source for well defined amplifiers is the mismatch between the differential input pairs of transistors. Generally, bipolar input transistors can be matched to a millivolt or less, while FET transistors can be matched to only about five millivolts. In certain high gain applications, this offset voltage can exceed the signal level.

Prior art solutions that minimize the offset voltage have all required either drastically reducing the bandwidth of the operational amplifier or introducing periods of interrupted service during which the offset signal is first calibrated and then canceled.

In the pre-transistor era, the offset problem was solved with chopper stabilized amplifiers. Chopper stabilized amplifiers use high speed electromechanical relays for switching the inputs. A single coil is used to drive multiple sets of synchronized contacts. In one such technique, the contacts rapidly reverse the polarities of the inputs and outputs in synchronization so that the polarity of amplification of the signal never changes. However, since the offset can be considered lumped and fixed to one input of the amplifier, the offset voltage appears first positive and then negative at the output. A low pass filter then removes the offset voltage square wave. This technique severely limits effective amplifier operation to very low frequencies, typically, 100 Hz or less. Another drawback is the discontinuities in the output signal, caused by the rapid switching.

Another technique utilizes integrated circuits with FET capability in which the amplifier is momentarily switched out of service and then reconfigured in such a way that the offset voltage is stored in a capacitor. When the amplifier is returned to service the capacitor is typically placed in series with the input; hence, very nearly canceling out the offset. This solution is only practical, however, in applications where the amplifier does not need to be in continuous service. Examples of this technique include: Guleznski (U.S. Pat. No. 4,749,953), Dwarakanath (U.S. Pat. No. 4,306,196), Rybicki (U.S. Pat. No. 5,410,270), and Bingham (U.S. Pat. No. 4,546,324). Guleznski, in another invention (U.S. Pat. No. 4,829,263), uses a more complex scheme to minimize the switching time by using two interchangeable amplifiers.

In Vinn (U.S. Pat. No. 5,061,900) a digital version is illustrated where the offset voltage is first digitized. The Vinn invention requires less frequent calibration, but at the expense of much greater circuit complexity.

The deviations of operational amplifier voltage offset generally constitute a serious obstacle to precision circuit design and force tradeoffs in circuit configuration. Thus, designing an operational amplifier circuit with minimum offset voltage further advances amplifier selection for use in sensitive circuit applications.

The use of a FET in the sub-threshold region to minimize the offset voltage has been taught in U.S. Pat. No. 4,201,947 issued to Schade on May 6, 1980, entitled, "LONG-TAILED-PAIR CONNECTIONS OF MOSFET'S OPERATED IN SUB-THRESHOLD REGION". Schade biased MOSFET transistors by adjusting the tail current for operation in the sub-threshold region. The reduction of the tail current is achieved by increasing the resistor between two biased transistors and a remote power supply. The Schade invention achieves this result by biasing the transistor inputs only, without any further adjustment of the outputs of the FET amplifiers as part of the reduction technique.

Additionally, although the prior art seeks to subject each of the sub-portions of the broadband spectrum to special treatment such that nonlinear amplification results, based on frequency, it does not seek to produce undistorted linear amplification across the entire broadband spectrum of frequencies. In many instances, the prior art techniques also do not address the dc offset.

In U.S. Pat. No. 4,922,535 issued to Dolby on May 1, 1990, entitled, "TRANSIENT CONTROL ASPECTS OF CIRCUIT ARRANGEMENTS FOR ALTERING THE DYNAMIC RANGE OF AUDIO SIGNALS", a system of audio compression and decompression is taught which minimizes the effect of any noise introduced in a noisy transmission channel. The Dolby method breaks the audio signal into both high and low frequency portions and then treats three ranges of signal amplitude separately. Only a sub-portion of the broadband frequency is addressed, without utilizing the dc signal path.

Bearing in mind the problems and deficiencies of the prior art, it is therefore an object of the present invention to provide a FET amplifier with very low offset voltage.

It is another object of the present invention to provide an amplifier that is not bandwidth limited when the offset is reduced.

A further object of the invention is to provide a circuit that extends bipolar features of low offset voltages to FET operational amplifiers.

It is yet another object of the present invention to provide an operational amplifier circuit that minimizes the offset voltage caused by mismatch between a differential input pair of transistors.

Still other advantages of the invention will in part be obvious and will in part be apparent from the specification.

SUMMARY OF THE INVENTION

The above and other advantages, which will be apparent to one of skill in the art, are achieved in the present invention which is directed to, in a first aspect, an amplifier circuit comprising: a low-offset-amplifier including a low-offset-amplifier input and a low-offset-amplifier output, wherein the low-offset-amplifier includes a plurality of field effect transistor devices operable in a sub-threshold region; a broadband-amplifier including a broadband-amplifier input coupled to the low-offset-amplifier input, and a broadband-amplifier output; and, means for coupling between the broadband amplifier output and the low-offset-amplifier output to minimize offset voltage of the amplifier circuit.

Preferably, the broadband amplifier input and the low-offset-amplifier input are each differential inputs, and the broadband amplifier output and the low-offset-amplifier output are each differential outputs.

Importantly, the means for coupling the outputs includes capacitive coupling.

Additionally, in the first aspect, the amplifier circuit further comprises means for summing the broadband amplifier output and the low-offset-amplifier output.

The present invention is directed to, in a second aspect, a circuit providing for an operational amplifier with low offset and broad bandwidth characteristics, including two input stages, comprising: a first input stage including a dc and low frequency field effect transistor amplifier with a first operational gain, operable in a sub-threshold region, and adapted to provide a low frequency amplifier output; a second input stage including a broadband field effect transistor amplifier with a second operational gain, operable in a linear region and saturation region above threshold, and adapted to provide a broadband amplifier output; means for coupling the low frequency amplifier output and the broadband amplifier output to produce a coupled output; and, means for summing the coupled output.

In this second aspect, the first and second input stages are comprised of differential inputs with transistors having predetermined width/length ratios, and differential outputs. Further, the first and second operational gains are adjustable by either resistive means or by adjusting the predetermined width/length ratios of the transistors.

The low frequency amplifier is operable in a sub-threshold region by adjusting a first voltage reference signal. Whereas, the broadband amplifier is operated above the sub-threshold region by adjusting a second voltage reference signal.

The capacitive coupling comprises a plurality of capacitors for connecting the differential outputs of the broadband amplifier to the differential outputs of the low-frequency amplifier. The capacitor values are predetermined to adjust a cross-over frequency of the circuit in a range of approximately 15 kHz to 50 kHz.

The present invention relates to, in a third aspect, an amplifier circuit comprising: a first amplifying means with a first power supply, a differential input comprising of a first and second transistor means, and a differential output comprising of a first and third output means, the first amplifying means adapted to operate at dc and low frequencies; a second amplifying means with a second power supply, a differential input comprising of a third and fourth transistor means, and a differential output comprising of a second and fourth output means, the second amplifying means operable at broadband frequencies, higher than the low frequencies; a first signal input connected to the first and third transistor means, and a second signal input connected to the second and fourth transistor means, such that the first and second signal inputs are differentially received by the transistor means; a first capacitive coupling means between the first and second differential outputs; a second capacitive coupling means between the third and fourth differential outputs; and, a combining means to differentially receive the differential outputs.

This amplifier further comprises: a first voltage reference source adjustable to maintain operation of the first amplifying means within a sub-threshold region; a second voltage reference source adjustable to maintain operation of the second amplifying means above the sub-threshold region; and, a transistor means of the first amplifying means adapted to shift a common mode output of the first amplifying means to a value approximately midway between the first and second power supplies.

In a fourth aspect, the present invention relates to an amplifier circuit comprising: a first amplifier with a first power supply, a differential input comprising of a first and second transistor, and a differential output comprising of a first and third output, the first amplifier operable at dc and low frequencies; a second amplifier with a second power supply, a differential input comprising of a third and fourth transistor, and a differential output comprising of a second and fourth output, the second amplifier operable at broadband frequencies, higher than the low frequencies; a first signal input terminal connected to the first and third transistors, and a second signal input terminal connected to the second and fourth transistors, such that the first and second signal inputs are differentially received by the differential input transistors; a first capacitor between the first and second differential outputs; a second capacitor between the third and fourth differential outputs; a differential amplifier to differentially receive the differential outputs; a first voltage reference source adjustable to maintain operation of the first amplifier at a sub-threshold level; a second voltage reference source adjustable to maintain operation of the second amplifier above the sub-threshold level; and, a transistor of the first amplifier for shifting a common mode output of the first amplifier to a value approximately midway between the first and second power supplies.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS(S)

Figure 1:
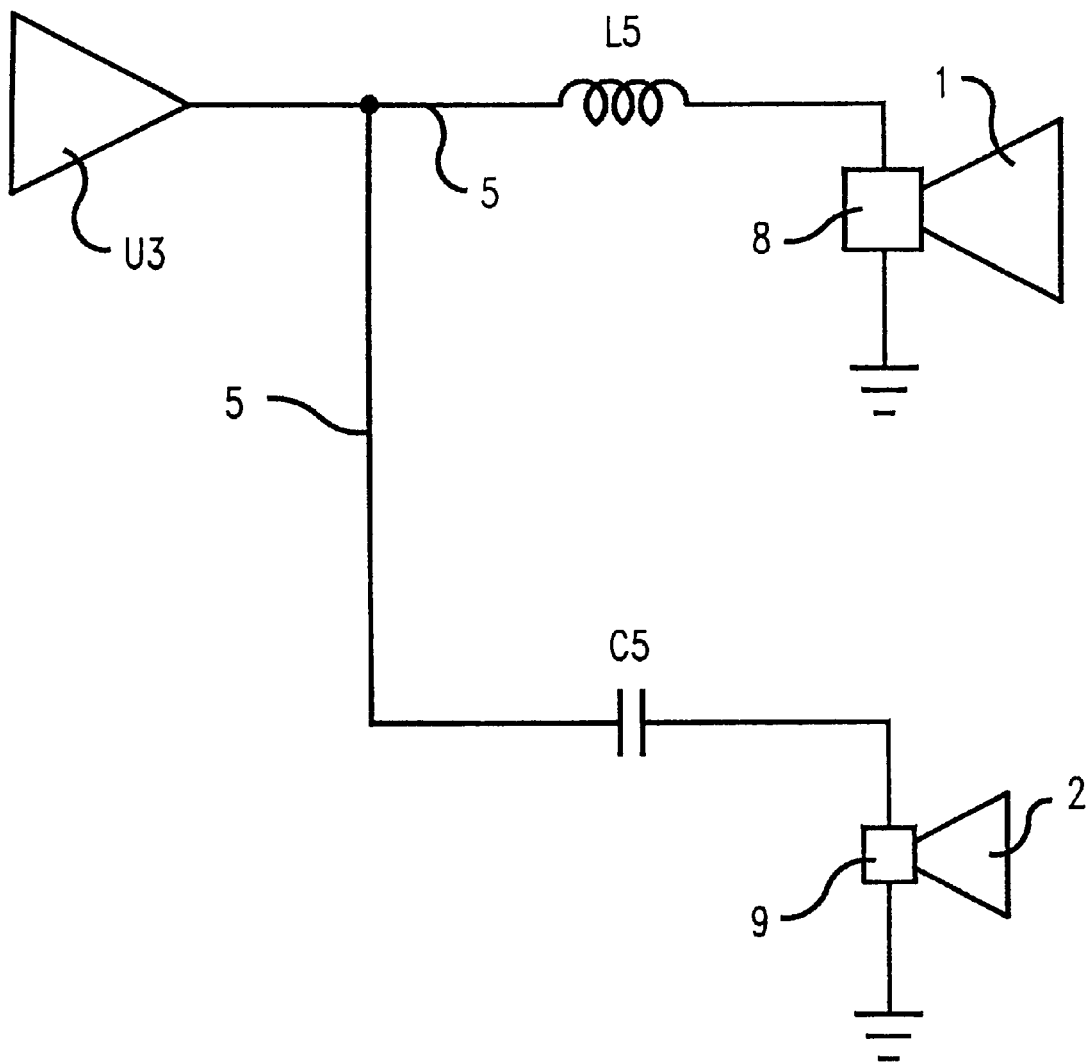
FIG. 1 is a schematic representing a prior art application.

In describing the preferred embodiment of the present invention, reference will be made herein to FIGS. 1–5 of the drawings in which like numerals refer to like features of the invention. Features of the invention are not necessarily shown to scale in the drawings.

Voltage offsets at the input are obvious sources of error. Although some operational amplifiers have offset adjustment terminals, it remains beneficial to have an amplifier with inherently low initial offset voltage, $V_{OS}$, because offset voltage drift and common mode rejection are degraded by the unbalance caused by any offset adjustment trimmer. FET-input operational amplifiers suffer from larger initial offsets and much larger drifts of offset voltage with temperature deviations than do bipolar transistor operational amplifiers.

The present invention is an operational amplifier circuit of the type which may be used, for example, as a sub-circuit in a more complex integrated circuit. The preferred embodiment of the present invention uses two differential input stages to separately achieve two important desired properties in an operational amplifier: low offset and broad bandwidth. The invention utilizes standard features inherent with CMOS technology, namely: a) the extraordinarily high input impedance of IGFETs (Isolated Gate FETs) or MOSFETs (Metal Oxide Semiconductor FETs); b) the uniformity of CMOS stage gain whether biased in the saturation or in the sub-threshold region; and, c) the high output impedance ratio between the two differential input stages.

Following the two differential input stages, the signal paths are recombined for subsequent amplification.

To some degree, the present invention is reminiscent of a technique used in high fidelity sound systems, as indicated in the circuit depicted in FIG. 1, wherein a cross-over network 5 was used to separate the frequencies of the output of amplifier U3 for the woofer 1 and the tweeter 2 speakers. Inductor L5, with inductance L and impedance $j\omega L$, will pass low frequencies to the woofer load 8, while capacitor C5, with capacitance C and impedance $1/j\omega C$, passes the higher frequency signals to the tweeter load 9. In the present invention, however, the cross-over network is simpler, less critical, and used in reverse to combine the dc or "very low frequency path" with the high frequency or "broadband path".

Conceptually, the present invention is illustrated by reference to simplified circuit drawings that model the present invention's dominant electrical elements. These drawings show a logical arrangement of the dominant elements over segments of the frequency spectrum to illustrate the basic principles involved over the entire frequency spectrum. As the signal frequency changes, the properties of the dominant electrical elements also change, from resistive characteristics exhibited at the lower frequencies to the capacitive elements that dominate at the higher frequencies.

Figure 2A:
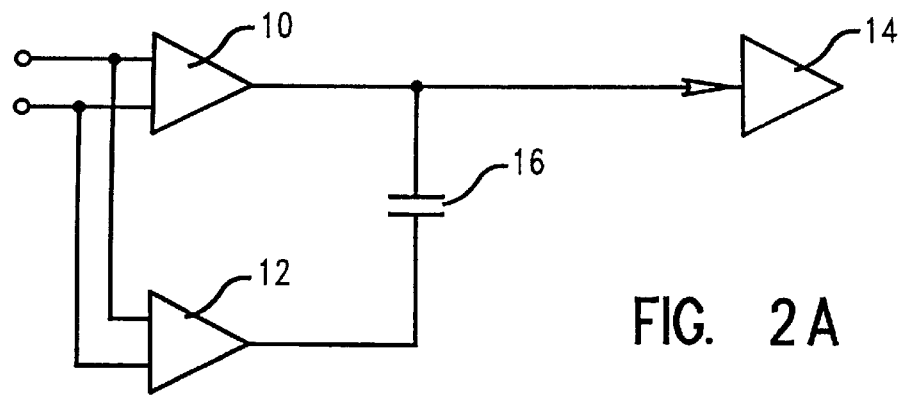
FIG. 2A is a schematic of the separate amplifier input stages.

FIG. 2A is a schematic of the invention showing the separate amplifier input stages for dc/very low frequencies, and broadband frequencies, depicted as amplifiers 10 and 12, respectively. Important to the present invention, all transistors in the dc stage, amplifier 10, are biased in the sub-threshold region. FET thresholds are known to be better matched in the sub-threshold region than in either the linear or saturation regions. The outputs of each amplifier are capacitively coupled by a capacitor 16, and the resultant signal subsequently amplified by amplifier 14. The single capacitor 16 (along with any inherent stage impedance) forms the "cross-over" network for the circuit.

Figure 2B:
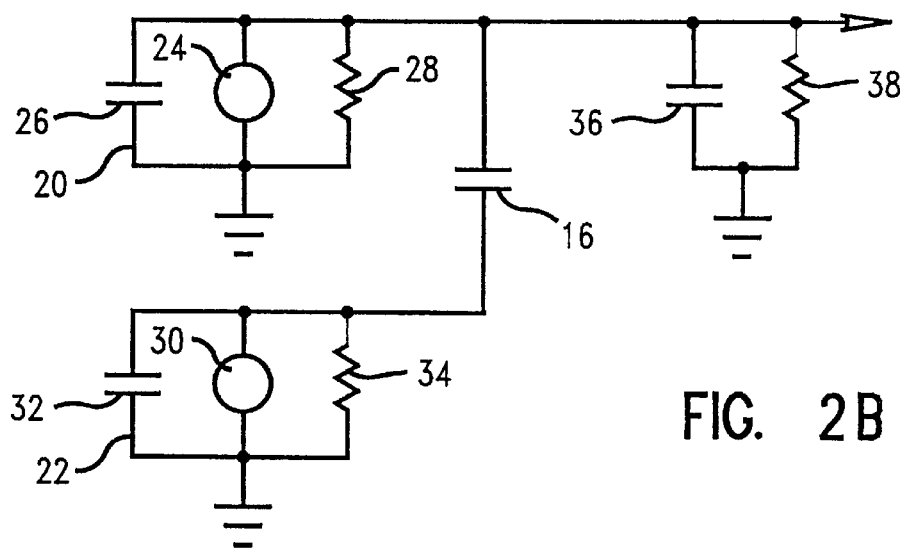
FIG. 2B is a modeled representation of the simplified circuit of FIG. 2A, with each input stage represented by transconductance and output impedance.

FIG. 2B depicts a modeled representation of the simplified circuit of FIG. 2A, with each input stage of the operational amplifiers 10, 12 represented by their transconductance and output impedance. Each input operational amplifier transconductance model 20, 22 is shown as a current source 24, 30 with lumped capacitance 26, 32 and resistance 28, 34. The subsequent amplifier stage 14 is represented by the input impedance 36, 38.

Figure 2C:
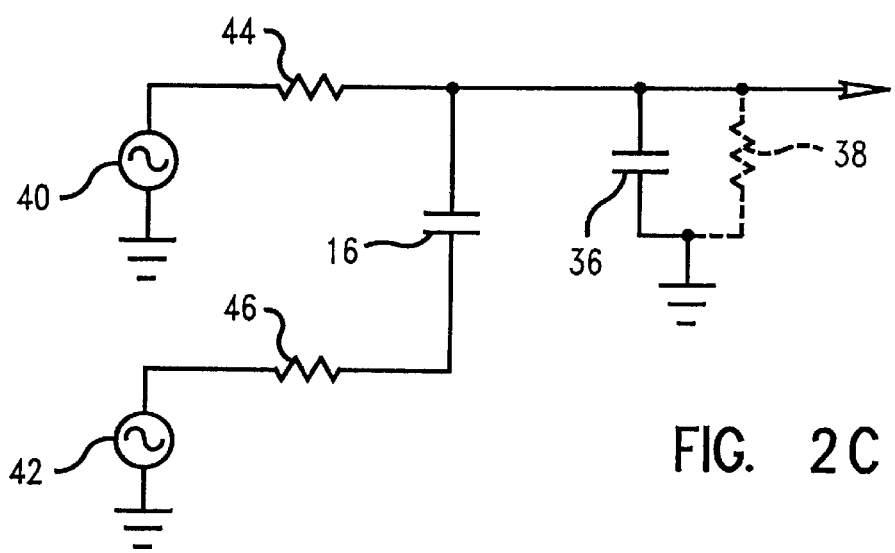
FIG. 2C is a modeled representation showing the transconductance and output resistance transformed into equivalent voltage sources and series resistors.

FIG. 2C shows the transconductance and output resistance transformed into equivalent voltage sources 40, 42 and series resistance 44, 46. The dc operational amplifier is shown with voltage source 40, and series resistance 44 coupled to the broadband amplifier series resistance 46 through cross-over capacitor 16. Preferably, the cross-over capacitance 16 is approximately twenty times the input capacitance of the next stage; the capacitance 36 of the subsequent amplifier stage. For example, cross-over capacitor 16 may be on the order of 125 femtofarads while the capacitance of the subsequent stage is on the order of 8 femtofarads. Also, it is preferred to have the resistance values differ from one another by one hundred times or more. Preferably, typical resistance values are 10K ohm for the broadband amplifier resistor model 46, 10M ohm for the dc amplifier resistor model 44, and 1G ohm or more for the subsequent stage amplifier input resistor model 38.

Figure 2D:
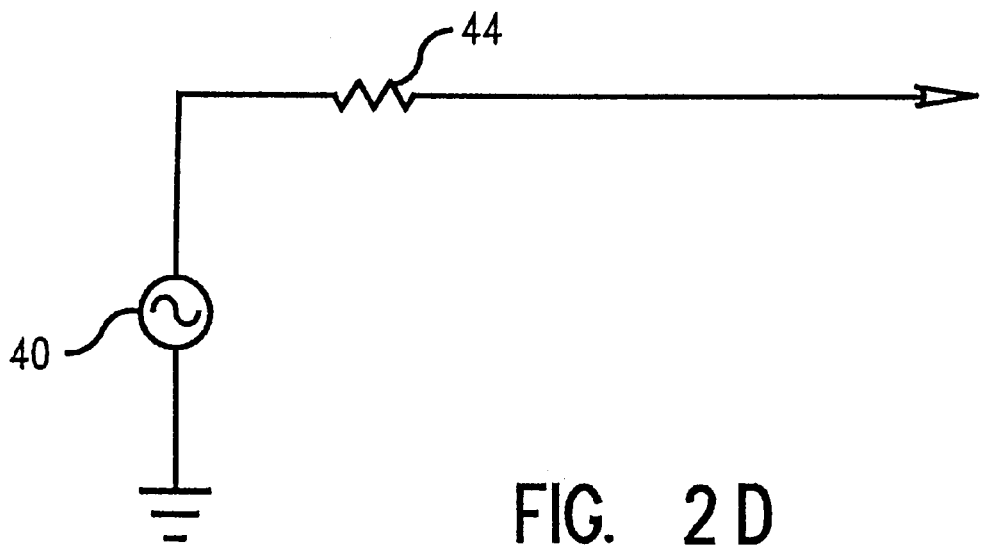
FIG. 2D is a model of the network of FIG. 2C with the dominant modeled elements portrayed at low frequency.

FIGS. 2D, 2E, 2F, and 2G depict the network of FIG. 2C with only the dominant modeled elements portrayed at given frequency intervals. At dc level and frequencies near dc, the high impedance of the cross-over capacitance 16 effectively disconnects the broadband input stage from the subsequent amplifier stage. This yields a modeled input of simply the dc amplifier with voltage source 40 and series resistance 44 as shown in FIG. 2D. In this figure, although not shown, the input impedance model of the subsequent stage would also have dominant resistive characteristics.

Figure 2E:
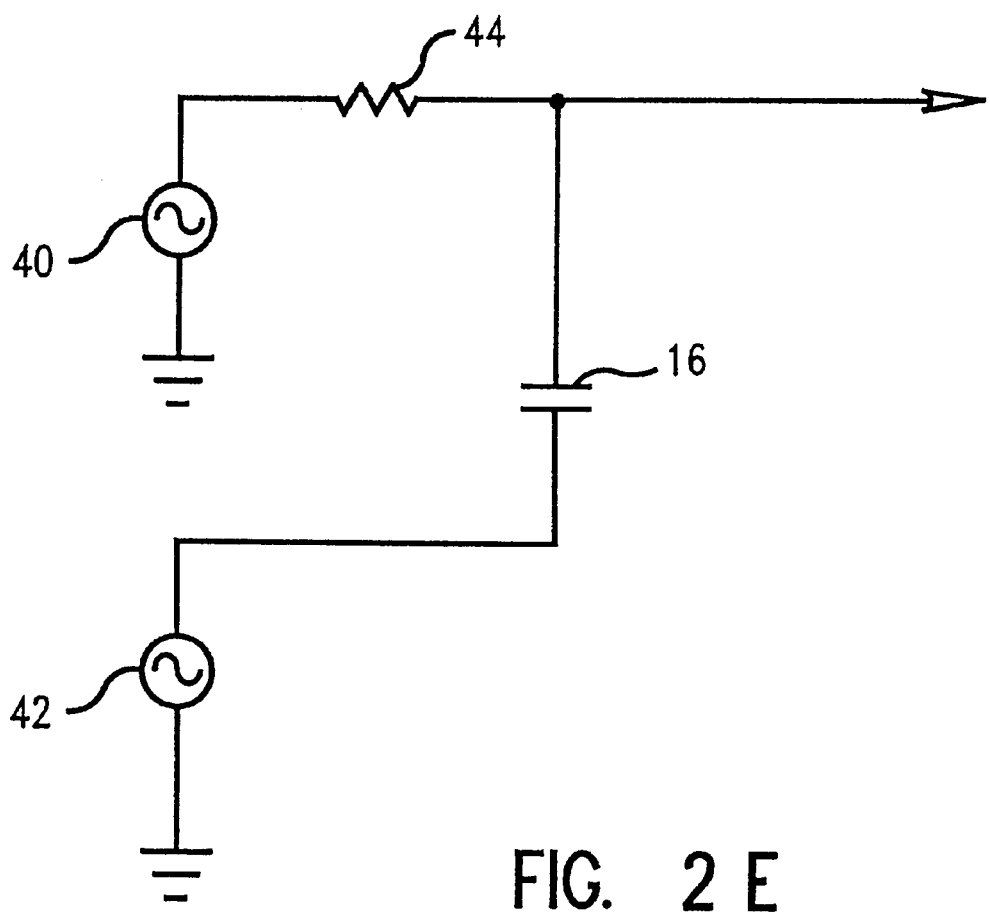
FIG. 2E is a model of the network of FIG. 2C with the dominant modeled elements portrayed for the cross-over frequency regime.

At the cross-over frequency, there is typically very little attenuation in the cross-over network because both input signals are of approximately equal amplitude and in phase. FIG. 2E depicts the effective network in the cross-over frequency regime. The input impedance of the subsequent amplifier stage remains high compared to both the cross-over capacitance 16 and the output impedance 44 of the dc amplifier stage. The series resistance of the broadband amplifier model, 46 of FIG. 2C, is negligible in this frequency regime as the capacitor 16 impedance dominates. Preferably, the subsequent stage input impedance is approximately twenty times the impedance of the cross-over capacitor and the dc amplifier.

Figure 2F:
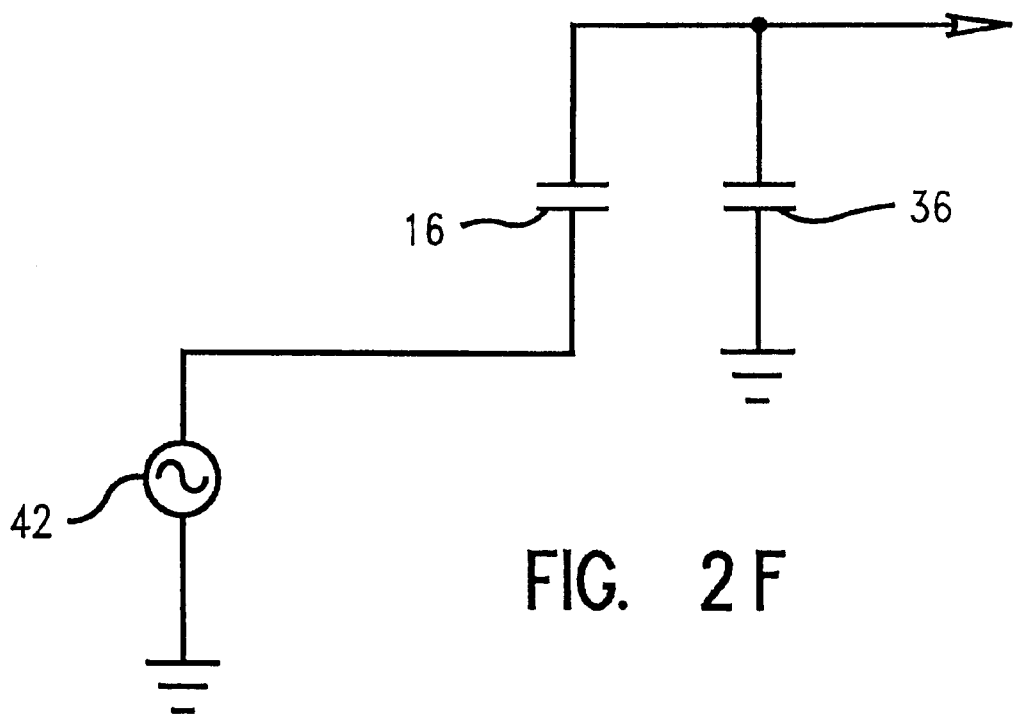
FIG. 2F is a model of the network of FIG. 2C with the dominant modeled elements portrayed for the higher frequencies in the middle of the broadband.

FIG. 2F shows the dominant elements of the effective network model at the higher frequency values in the middle of the broadband. As depicted, the input capacitor of the subsequent stage 36 and the cross-over capacitor 16 dominate and form a capacitor divider. Given the preferred capacitor values for these elements, previously discussed, the divider network will typically allow for approximately 94% of the signal from the broadband amplifier input stage to pass through to the subsequent amplifier stage.

Figure 2G:
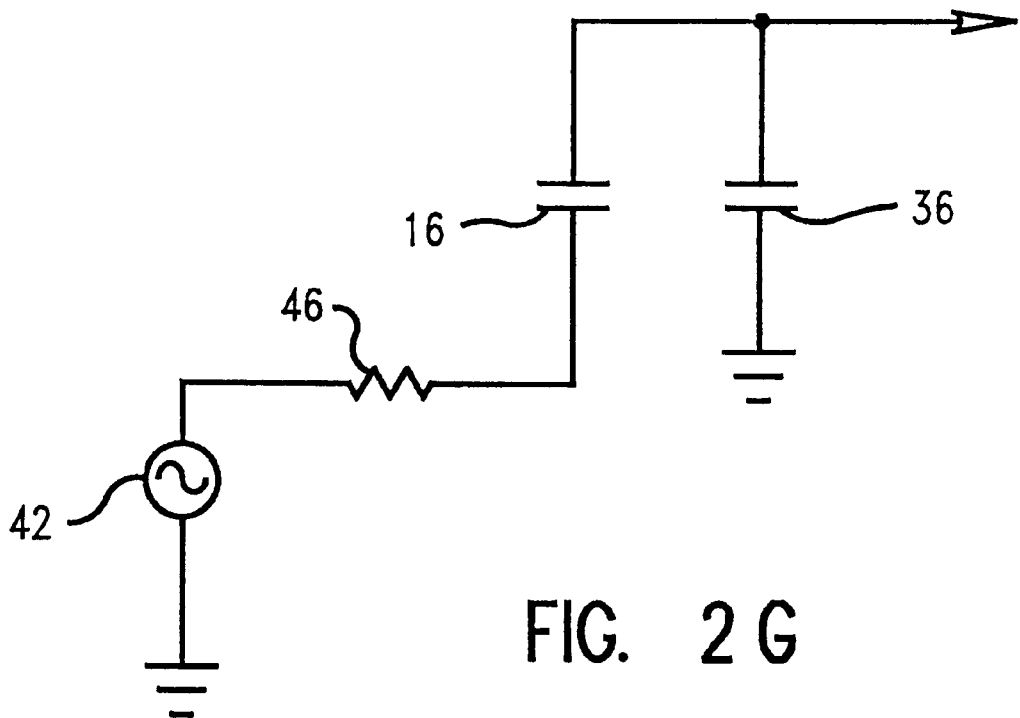
FIG. 2G is a model of the network of FIG. 2C with the dominant modeled elements portrayed for extremely high frequency signals.

At extremely high frequencies, the network is characterized only by the output resistance of the broadband amplifier stage and the input capacitance of the subsequent amplifier stage, as shown in FIG. 2G. The cross-over capacitor will tend to look like a short at these frequencies. Although FIG. 2G depicts an extremely high frequency model, the cross-over capacitor 16 remains shown in the figure as a reminder that its chief function is to block the dc path to the broadband amplifier.

Figure 3:
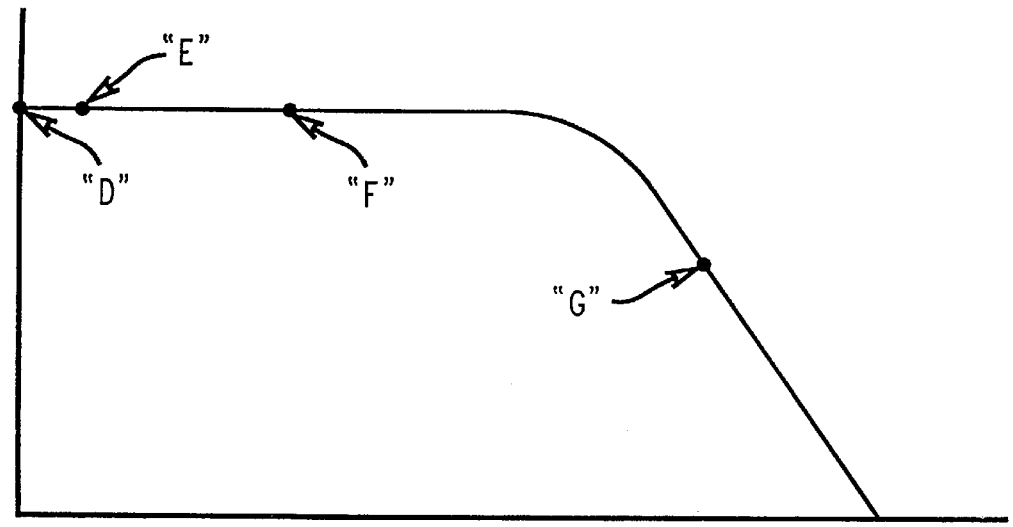
FIG. 3 is a representation of an overall frequency versus gain curve for the modeled circuit.

FIG. 3 is a representation of an overall frequency versus gain curve for the modeled circuit, indicating each relative frequency segment corresponding to the individual models discussed above. For example, point "D" refers to the frequency regime where the circuit can be characterized by the model shown in FIG. 2D. The other frequency points accordingly correspond to the modeled representations indicated by the appropriate FIG. 2 model.

Figure 4:
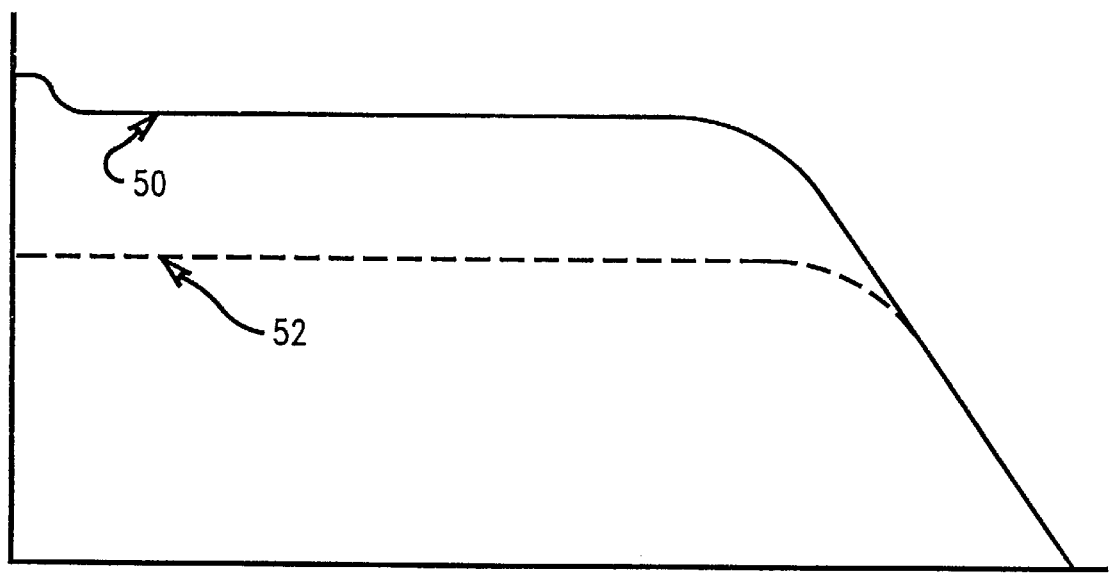
FIG. 4 is an illustrative gain versus frequency plot for two amplifier stages with poorly matched gain, including the effect of negative feedback on neutralizing the gain mismatch.

FIG. 4 shows an illustrative gain versus frequency plot for the overall amplifier assuming the gains of the two input stages are not equal. Typically, when an operational amplifier with such characteristics is placed in a negative feedback network the small gain non-uniformity is greatly reduced. Line 50 of FIG. 4 depicts the potential for lower gain at broadband frequencies. Line 52 depicts the reduced non-uniformity when negative feedback is applied to neutralize the gain mismatch.

Figure 5:
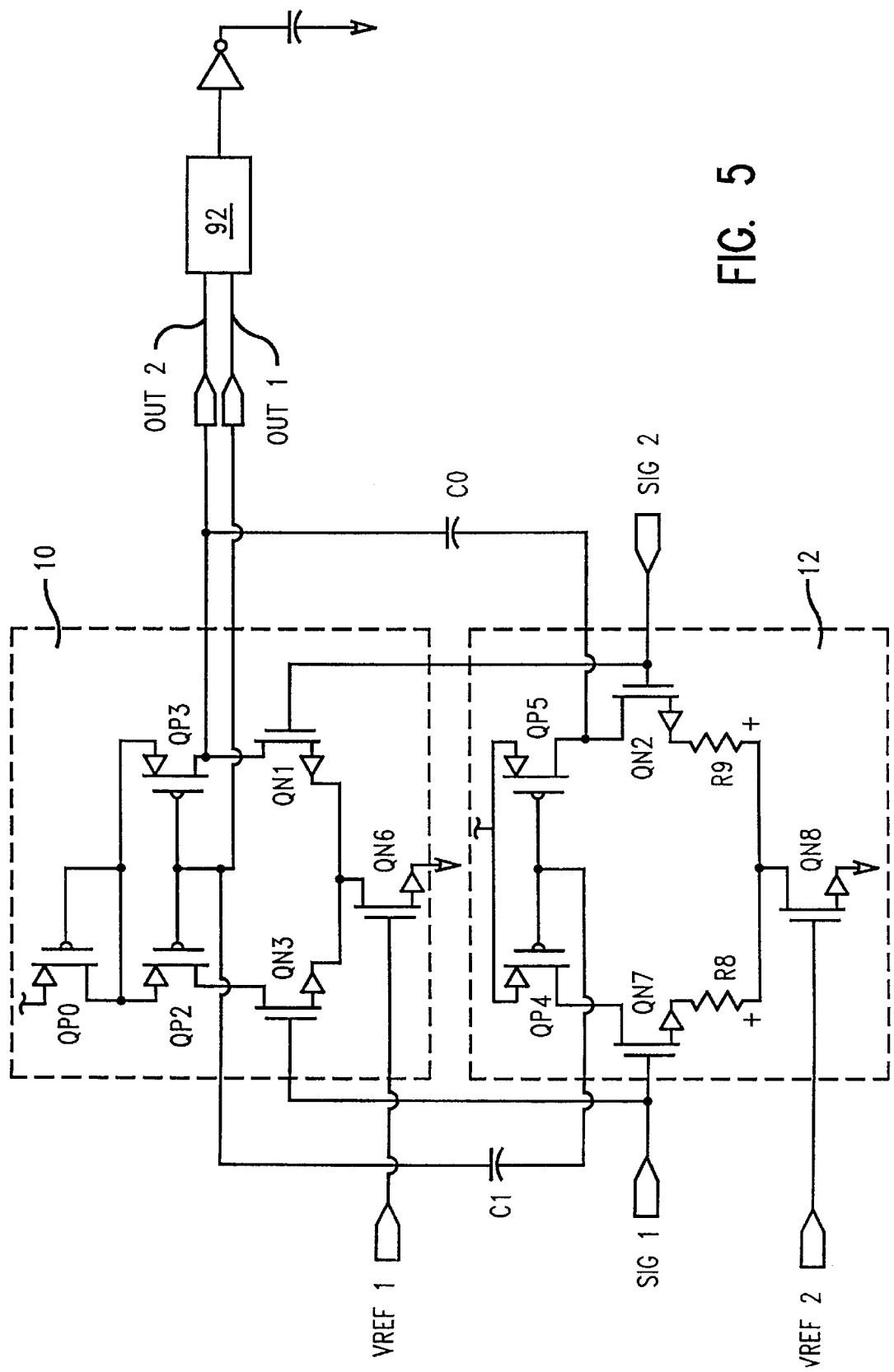
FIG. 5 is a schematic circuit diagram of an exemplary embodiment of the present invention.

The inventors have shown, through modeling of the circuit in FIG. 5 depicting the preferred embodiment, that the cross-over frequency could be conveniently adjusted between 15 kHz and 50 kHz using small practical values of capacitance for the cross-over capacitor. This contrasts to the background example of FIG. 1 where the relative values for inductance and capacitance must be precisely determined for proper full frequency spectrum operation. The gain of the broadband stage may also be adjusted so that it is higher than the dc amplifier stage by approximately as much as six percent. Thus, the higher gain of the broadband stage is compensated by the signal loss through the cross-over network, leading to a more preferred gain uniformity than that depicted in FIG. 4.

FIG. 5 is a schematic circuit diagram of an exemplary embodiment of the present invention. The circuit of FIG. 5 is composed of two input differential amplifiers, each with differential outputs. The dc/low frequency amplifier 10, operating in the sub-threshold region, is depicted by transistors QP0, QP2, QP3, QN1, QN3, and QN6. This amplifier is designed to exhibit very low offset. Voltage reference VREF1 is an adjustable voltage input to transistor QN6 to assure operation of the dc amplifier 10 in the sub-threshold region. Transistor QP0 shifts the common mode output to a value suitable for driving the next stage. Preferably, this value is approximately midway between the power supplies. The broadband amplifier 12, operating in the linear and saturation regions, is depicted by transistors QP4, QP5, QN2, QN7, and QN8. This amplifier can tolerate a relatively large offset voltage. Voltage reference VREF2 is an adjustable voltage input to transistor QN8 to assure operation of the broadband amplifier above threshold. The differential inputs SIG1 and SIG2 are directly connected to the inputs of both operational amplifiers; transistors QN1 and QN3 for the dc amplifier, and transistors QN2 and QN7 for the broadband amplifier. Resistors R8 and R9 are provided for adjusting the gain of the operational amplifiers. However, obtaining the desired gain balance between the two input stages may also be achieved by adjusting the width/length ratios of the amplifier transistors.

The two differential outputs of both amplifiers are coupled together through cross-over capacitors C1 and C0 to produce signal outputs OUT1 and OUT2, which become the inputs to the subsequent amplifying stages depicted by amplifier 92. In the preferred embodiment, the broadband amplifier is designed for a gain of approximately sixty, while the dc amplifier exhibits negligible design dependent offset voltage.

Thus, by extending bipolar features of low offset voltages to FET operational amplifiers, an amplifier is provided that is not bandwidth limited, and minimizes the offset voltage caused by the mismatch between a differential input pair of transistors.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An amplifier circuit comprising:
    a low-offset-amplifier including a low-offset-amplifier input and a low-offset-amplifier output, said low-offset-amplifier including a plurality of field effect transistor devices biased in a sub-threshold region;
    a broadband-amplifier including a broadband-amplifier input coupled to said low-offset-amplifier input, and a broadband-amplifier output, said broadband amplifier being biased above a threshold region; and,
    means for coupling between said broadband amplifier output and said low-offset-amplifier output to minimize offset voltage of said amplifier circuit.

2. The amplifier of claim 1, wherein said broadband amplifier input and said low-offset-amplifier input are each differential inputs.

3. The amplifier of claim 1, wherein said broadband amplifier output and said low-offset-amplifier output are each differential outputs.

4. The amplifier of claim 3 further comprising means for summing said broadband amplifier output and said low-offset-amplifier output.

5. A circuit providing for an operational amplifier with low offset and broad bandwidth characteristics, including two input stages, comprising:
    a first input stage including a dc and low frequency field effect transistor amplifier with a first operational gain, biased in a sub-threshold region, and adapted to provide a low frequency amplifier output;
    a second input stage including a broadband field effect transistor amplifier with a second operational gain, biased in a linear region and saturation region above threshold, and adapted to provide a broadband amplifier output;

means for coupling said low frequency amplifier output and said broadband amplifier output to produce a coupled output; and, means for summing said coupled output.

6. The circuit of claim 5 wherein said first and second input stages are comprised of differential inputs.

7. The circuit of claim 5 wherein said low frequency amplifier output and said broadband amplifier output are differential outputs.

8. The circuit of claim 5 wherein said first and second input stages are comprised of transistors with predetermined width/length ratios.

9. The circuit of claim 8 wherein said first and second operational gains are adjustable by adjusting said predetermined width/length ratios of said transistors.

10. A circuit providing for an operational amplifier with low offset and broad bandwidth characteristics, including two input stages, comprising:

a first input stage including a dc and low frequency field effect transistor amplifier with a first operational gain, operable in a sub-threshold region, and adapted to provide a low frequency amplifier output;

a second input stage including a broadband field effect transistor amplifier with a second operational gain, operable in a linear region and saturation region above threshold, and adapted to provide a broadband amplifier output;

means for coupling said low frequency amplifier output and said broadband amplifier output to produce a coupled output, said means for coupling comprising capacitive coupling; and, means for summing said coupled output.

11. The circuit of claim 10 wherein said capacitive coupling comprises a plurality of capacitors connecting said differential outputs of said broadband amplifier to said differential outputs of said low-frequency amplifier.

12. The circuit of claim 11 wherein said capacitor values are predetermined to adjust a cross-over frequency of said circuit in a range of approximately 15 kHz to 50 kHz.

13. An amplifier circuit comprising:

a first amplifying means with a first power supply, a differential input comprising of a first and second transistor means, and a differential output comprising of a first and third output means, said first amplifying means adapted to operate at dc and low frequencies;

a second amplifying means with a second power supply, a differential input comprising of a third and fourth transistor means, and a differential output comprising of a second and fourth output means, said second amplifying means operable at broadband frequencies, higher than said low frequencies;

a first signal input connected to said first and third transistor means, and a second signal input connected to said second and fourth transistor means, such that said first and second signal inputs are differentially received by said transistor means;

a first capacitive coupling means between said first and second differential outputs;

a second capacitive coupling means between said third and fourth differential outputs; and, a combining means to differentially receive the differential outputs.

14. The amplifier circuit of claim 13 further comprising:

a first voltage reference source adjustable to maintain operation of said first amplifying means within a sub-threshold region;

a second voltage reference source adjustable to maintain operation of said second amplifying means above said sub-threshold region; and, a transistor means of said first amplifying means adapted to shift a common mode output of said first amplifying means to a value approximately midway between said first and second power supplies.

15. The amplifier circuit of claim 13, wherein said combining means further comprises a differential amplifier circuit.

16. An amplifier circuit comprising:

a first amplifier with a first power supply, a differential input comprising of a first and second transistor, and a differential output comprising of a first and third output, said first amplifier operable at dc and low frequencies;

a second amplifier with a second power supply, a differential input comprising of a third and fourth transistor, and a differential output comprising of a second and fourth output, said second amplifier operable at broadband frequencies, higher than said low frequencies;

a first signal input terminal connected to said first and third transistors, and a second signal input terminal connected to said second and fourth transistors, such that said first and second signal inputs are differentially received by the differential input transistors;

a first capacitor between said first and second differential outputs;

a second capacitor between said third and fourth differential outputs;

a differential amplifier to differentially receive said differential outputs;

a first voltage reference source adjustable to maintain operation of said first amplifier at a sub-threshold level;

a second voltage reference source adjustable to maintain operation of said second amplifier above said sub-threshold level; and, a transistor of said first amplifier for shifting a common mode output of said first amplifier to a value approximately midway between said first and second power supplies.

17. An amplifier circuit comprising:

a low-offset-amplifier including a low-offset-amplifier input and a low-offset-amplifier output, wherein said low-offset-amplifier includes a plurality of field effect transistor devices operable in a sub-threshold region;

a broadband-amplifier including a broadband-amplifier input coupled to said low-offset-amplifier input, and a broadband-amplifier output; and, means for coupling between said broadband amplifier output and said low-offset-amplifier output to minimize offset voltage of said amplifier circuit, said means for coupling including capacitive coupling.

18. A circuit providing for an operational amplifier with low offset and broad bandwidth characteristics, including two input stages, comprising:

a first input stage including a dc and low frequency field effect transistor amplifier with a first operational gain, operable in a sub-threshold region, and adapted to provide a low frequency amplifier output, said first operational gain being adjustable by resistive means;

a second input stage including a broadband field effect transistor amplifier with a second operational gain, operable in a linear region and saturation region above threshold, and adapted to provide a broadband amplifier output, said second operational gain being adjustable by resistive means;

means for coupling said low frequency amplifier output and said broadband amplifier output to produce a coupled output; and, means for summing said coupled output.

19. A circuit providing for an operational amplifier with low offset and broad bandwidth characteristics, including two input stages, comprising:

a first input stage including a dc and low frequency field effect transistor amplifier with a first operational gain, operable in a sub-threshold region, and adapted to provide a low frequency amplifier output, wherein operation in a sub-threshold region of the low frequency amplifier is adjustable by a first voltage reference signal;

a second input stage including a broadband field effect transistor amplifier with a second operational gain, operable in a linear region and saturation region above threshold, and adapted to provide a broadband amplifier output;

means for coupling said low frequency amplifier output and said broadband amplifier output to produce a coupled output; and, means for summing said coupled output.

20. A circuit providing for an operational amplifier with low offset and broad bandwidth characteristics, including two input stages, comprising:

a first input stage including a dc and low frequency field effect transistor amplifier with a first operational gain, operable in a sub-threshold region, and adapted to provide a low frequency amplifier output;

a second input stage including a broadband field effect transistor amplifier with a second operational gain, operable in a linear region and saturation region above threshold, and adapted to provide a broadband amplifier output, wherein operation above threshold of the broadband amplifier is adjustable by a second voltage reference signal;

means for coupling said low frequency amplifier output and said broadband amplifier output to produce a coupled output; and, means for summing said coupled output.

21. A circuit providing for an operational amplifier with low offset and broad bandwidth characteristics, including two input stages, comprising:

a first input stage including a dc and low frequency field effect transistor amplifier with a first operational gain, operable in a sub-threshold region, and adapted to provide a low frequency amplifier output;

a second input stage including a broadband field effect transistor amplifier with a second operational gain, operable in a linear region and saturation region above threshold, and adapted to provide a broadband amplifier output;

means for coupling said low frequency amplifier output and said broadband amplifier output to produce a coupled output; and, means for summing said coupled output, said summing means including a differential amplifier.

* * * * *